(12) United States Patent
Bode et al.

(10) Patent No.: US 7,941,262 B2
(45) Date of Patent: May 10, 2011

(54) METHOD FOR STORING PLANT PROCESS SIGNALS

(75) Inventors: Andreas Bode, Höchstadt (DE); Martin Hempl, Winkelhaid (DE)

(73) Assignee: Siemens Aktiengesellschaft, Munich (DE)

( * ) Notice: Subject to any disclaimer, the term of this patent is extended or adjusted under 35 U.S.C. 154(b) by 1050 days.

(21) Appl. No.: 10/587,274

(22) PCT Filed: Dec. 17, 2004

(86) PCT No.: PCT/EP2004/053555
§ 371 (c)(1),
(2), (4) Date: Jul. 25, 2006

(87) PCT Pub. No.: WO2005/071847
PCT Pub. Date: Aug. 4, 2005

(65) Prior Publication Data
US 2007/0162213 A1 Jul. 12, 2007

(30) Foreign Application Priority Data
Jan. 27, 2004 (EP) .................................. 04001690

(51) Int. Cl.
*G06G 7/70* (2006.01)
*G06F 19/00* (2011.01)
(52) U.S. Cl. ........................................................ 701/99
(58) Field of Classification Search .................... 701/99; 702/56, 57
See application file for complete search history.

(56) References Cited

U.S. PATENT DOCUMENTS

| | | | | | |
|---|---|---|---|---|---|
| 2,443,195 | A | * | 6/1948 | Pensyl | 327/508 |
| 4,031,407 | A | * | 6/1977 | Reed | 307/87 |
| 4,168,608 | A | * | 9/1979 | Uram | 60/773 |
| 4,184,324 | A | * | 1/1980 | Kiscaden et al. | 60/39.182 |
| 4,204,258 | A | * | 5/1980 | Zitelli et al. | 700/290 |
| 4,209,843 | A | * | 6/1980 | Hyatt | 708/422 |
| 4,302,813 | A | * | 11/1981 | Kurihara et al. | 702/56 |
| 4,435,770 | A | * | 3/1984 | Shiohata et al. | 702/56 |
| 4,445,180 | A | * | 4/1984 | Davis et al. | 700/289 |
| 4,488,236 | A | * | 12/1984 | Morrison et al. | 701/123 |
| 4,489,606 | A | * | 12/1984 | Shiohata et al. | 73/462 |
| 4,536,126 | A | * | 8/1985 | Reuther | 290/40 R |
| 4,803,638 | A | * | 2/1989 | Nottingham et al. | 702/36 |
| 5,012,449 | A | * | 4/1991 | Todd | 367/89 |
| 5,038,287 | A | * | 8/1991 | Taniguchi et al. | 701/99 |
| 5,046,121 | A | * | 9/1991 | Yonekawa et al. | 382/250 |

(Continued)

FOREIGN PATENT DOCUMENTS

EP 1289152 A1 5/2003

(Continued)

OTHER PUBLICATIONS

Fujishima et al., "Band Runlength coding -68 for low-power continuous micro-monitors", Custom Integrated Circuits, 1999, proceedings of the IEEE 1999 San Diego, CA, USA, May 16-19, 1999, pp. 291-294, XP 010340797.

(Continued)

*Primary Examiner* — Khoi Tran
*Assistant Examiner* — Kyung J Kim

(57) ABSTRACT

Disclosed is a method for storing process signals of a plant or technical installation. A compression method is adapted for a current operating state of the plant is applied to the set of process signals in accordance with the current operating state of the plant and a compressed process signal set which is determined during the application of the compression method is stored.

11 Claims, 1 Drawing Sheet

U.S. PATENT DOCUMENTS

| | | | | |
|---|---|---|---|---|
| 5,296,856 | A | 3/1994 | Mantong | |
| 5,384,763 | A | 1/1995 | Kim | |
| 5,479,168 | A * | 12/1995 | Johnson et al. | 341/110 |
| 5,757,866 | A * | 5/1998 | Kannari et al. | 375/347 |
| 5,837,899 | A * | 11/1998 | Dickerman et al. | 73/610 |
| 5,847,658 | A * | 12/1998 | Irie et al. | 340/683 |
| 5,995,910 | A * | 11/1999 | Discenzo | 702/56 |
| 6,177,898 | B1 * | 1/2001 | Ong | 341/155 |
| 6,243,139 | B1 * | 6/2001 | Takahashi et al. | 348/420.1 |
| 6,321,525 | B1 | 11/2001 | Rogers | |
| 6,438,484 | B1 * | 8/2002 | Andrew et al. | 701/100 |
| 6,536,284 | B2 * | 3/2003 | Bonanni | 73/660 |
| 6,567,709 | B1 | 5/2003 | Malm et al. | |
| 6,747,953 | B1 * | 6/2004 | Qureshi et al. | 370/235 |
| 7,113,871 | B2 * | 9/2006 | Renner | 702/35 |
| 2002/0040278 | A1 * | 4/2002 | Anuzis et al. | 702/56 |
| 2003/0200022 | A1 | 10/2003 | Streichsbier et al. | |
| 2003/0212530 | A1 | 11/2003 | Bibelhausen et al. | |
| 2004/0114809 | A1 * | 6/2004 | Kim | 382/232 |
| 2005/0143981 | A1 | 6/2005 | Koyanagi | |

FOREIGN PATENT DOCUMENTS

| | | |
|---|---|---|
| EP | 1 353 252 A2 | 10/2003 |
| JP | 5159185 A1 | 6/1993 |

OTHER PUBLICATIONS

Saytiner, et al., "A Level-Crossing Sampling Scheme for A/D Conversion", IEEE Transactions on Circuits and Systems II: Analog and Digital Signal Processing, New York, vol. 43, Apr. 1, 1996, pp. 335-339, p. 335, left column, line 12-line 13, XP 000592026.

* cited by examiner

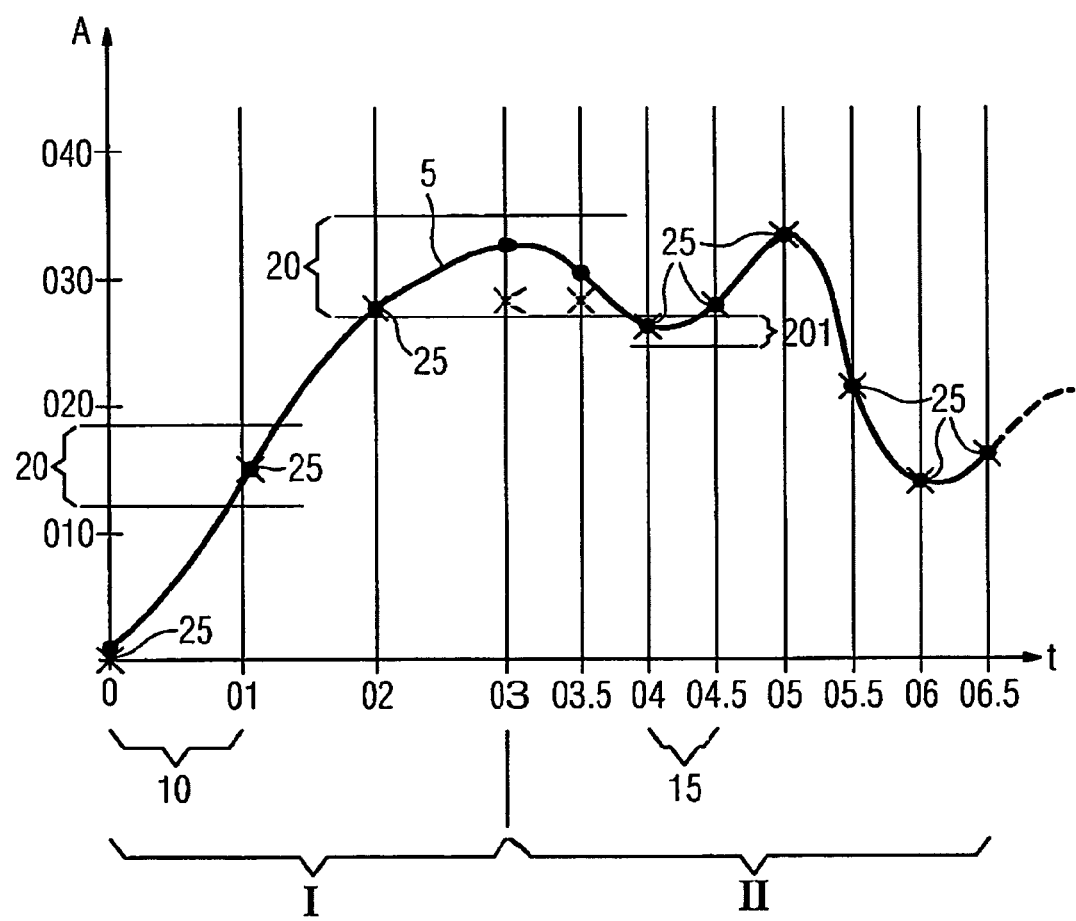

ately as is or must be compressed with the time response of the process signals being observed in the process. -->

METHOD FOR STORING PLANT PROCESS SIGNALS

CROSS REFERENCE TO RELATED APPLICATIONS

This application is the US National Stage of International Application No. PCT/EP2004/053555, filed Dec. 17, 2004 and claims the benefit thereof. The International Application claims the benefits of European application No. 04001690.9 EP filed Jan. 27, 2004, both of the applications are incorporated by reference herein in their entirety.

FIELD OF INVENTION

The invention relates to a method for storing plant process signals wherein, during operation of the plant, a number of process signals associated with the various processes are produced which are to be fed to a storage device.

BACKGROUND OF INVENTION

In order to be able to assess the behavior of a plant during operation or retrospectively, it is necessary to store a mostly large number of process signals produced during operation and to analyze their characteristics as function of time.

These process signals usually originate from different components and must be combined into a data stock and assessed according to defined evaluation criteria.

After only a short time, even an average sized plant will have generated a multitude of process signals whose storage and further processing e.g. for diagnostic purposes quickly uses up or overextends the resources available.

In these circumstances bottlenecks generally arise directly at storage due to the enormous storage space requirement, during further processing e.g. by means of analysis algorithms, —the algorithms having to process a very large data stock, or during transmission of the stored process signals to an evaluation computer which interrogates the stored process signals e.g. by remote access, particularly via the Internet.

Particularly in the last mentioned case, the transmission times are very long if the stock of stored process signals is very large.

To overcome these problems, a known solution is to subject the process signals to compression before storing them, so that the storage space required is reduced.

The disadvantage of this is that, particularly in the case of compression methods having a high compression rate, information concerning the time response of the process signals is lost which is crucial for detailed examination of a plant operating state.

SUMMARY OF INVENTION

The object of the invention is therefore to specify an improved method for storing plant process signals which has a reduced storage space requirement and for which in particular any loss of important information contained in the process signals is avoided.

This object is achieved according to the invention by a method for storing plant process signals wherein, depending on the current operating state of the plant, a compression method matched to the current operating state is applied to the set of process signals and a compressed process signal set thereby determined is stored.

The invention is based on the consideration that methods for compressing data always constitute a compromise between a reduced storage space requirement and loss of information.

Conserving storage resources therefore necessarily means losing information. Conversely, retaining as much information content as possible means a reduced compression rate.

With the method according to the invention, provision is therefore made for matching the compression method used to the current operating state. This means that, for example, during an operating phase in which the process signals to be stored barely change, a compression method with high compression rate is used, whereas in operating phases during which the process signals change markedly, a compression method with low compression rate is used.

The compression method used can also be selected according to whether short-term or long-term analysis of the process signals to be stored is intended. For long-term analysis in which the process signals produced over a long period of time are to be stored and then analyzed, a compression method with high compression rate is a beneficial solution, since for long-term analysis mainly significant signal changes are to be considered and not every small signal change is necessarily of importance.

On the other hand, even small signal changes are of interest for short-term analysis, for which reason a compression method with low compression rate is—a beneficial solution.

The process signals are advantageously acquired simultaneously, so that the set of process signals corresponds to a particular point in time.

This provides a high degree of comparison accuracy when comparing two sets of process signals acquired at two different instants ("fingerprints"), as each instant corresponds to a momentary operating instant of the plant, thereby enabling two operating points to be precisely compared with one another.

In an advantageous embodiment of the invention, the operating state of the plant changes and at least two different compression methods are used.

In this embodiment, the two or more different compression methods are used to take account of the special requirements of a changing operating state in respect of evaluation of the process signals produced.

For example, a turbine plant has at least two operating phases, namely a startup phase with generally markedly changing process signals and a normal mode which follows the startup phase and during which the process signals produced tend to be constant or at least change less markedly.

The operating state in the startup phase is therefore characterized in particular by markedly changing process signals which are preferably subjected to a compression method with low compression rate in order to minimize the loss of information.

The normal mode operating phase on the other hand is more likely to be characterized by constant process signals, for which reason the compression method provided for use during this operating phase is preferably a compression method with high compression rate.

In addition to having different compression rates, the two different compression methods may also differ in that a technically or mathematically different kind of compression method is used which is appropriately matched to the operating state obtaining.

In another preferred embodiment, the compression method involves acquiring the process signals at specifiable intervals.

During plant operation, the process signals are generally produced continuously and picked up by means of sensors.

The output signals of the sensors can now either be continuously stored, e.g. by means of an analog recording instrument, or they are only sampled at particular intervals and the signal values present at the sampling instants are stored, the process signal values arising between the sampling instants being lost.

With the present embodiment it is provided that the sampling frequency used for the compression method can be varied by setting the interval between two samplings. A short interval between two samplings results in a low compression rate and is particularly suitable for storing process signals during a operating state in which the process signals have not yet settled and therefore exhibit more marked changes with respect to time.

A large time interval between two samplings results in a high compression rate and is particularly suitable for operating states during which the process signals have already settled and do not therefore generally undergo major changes.

If a disturbance occurs during an operating state in which the process signals have settled, this can be detected immediately as a new operating state and another compression method is used, e.g. a compression method with shorter intervals between two samplings of the process signals.

Consequently, the size of the time intervals is advantageously selected depending on the current operating state of plant.

In another embodiment of the invention, the compression method involves examining at least one of the process signals to ascertain whether the process signal has remained within its amplitude band since it was last stored and how long ago it was last stored, the process signal only being stored if it was last stored longer than a specified time interval beforehand.

In this embodiment, compression of the accruing process signals for storage takes place by storing the relevant process signal(s) again only if their current values have changed more markedly since the last time they were stored than a predefined variation (amplitude band). This avoids continuously storing the current value of the process signal(s) even though their value has only changed slightly. A slight change in this context means that the current value of the process signal compared to the previously stored value of the same process signal is still within the amplitude band.

For this embodiment it is additionally provided that the process signal, despite remaining within its amplitude band, is stored again if it was last stored long enough beforehand. Consequently, in this embodiment the value of the process signal is not stored at each sampling instant, but only after the predefined time interval has elapsed whose size can be specified in advance or even determined as a function of the current operating state.

Thus smaller changes in the process signal are also stored—not, however, at each sampling instant, by only after the specified time interval has elapsed which is preferably greater than the time between two sampling instants. This saves storage space and simultaneously allows even smaller signal changes to be detected even if the time characteristic of the process signal lies within the amplitude band.

By contrast, with conventional compression methods such slowly drifting process signals are not handled on a different basis, but are considered as supposedly constant. Information loss therefore occurs using conventional methods.

The compression method preferably involves examining at least one of the process signals to determine whether the process signal has left a further amplitude band since the last time it was stored, storage of the process signal only being undertaken after it has left—the further amplitude band.

In this embodiment, compression of the process signals to be stored takes place in such a way that not every change in the signal is acquired for storage but that storage only takes place if the process signal has changed "markedly enough", i.e. its value has left the predefined further amplitude band.

All the process signal values encompassed by the further amplitude band are not stored again, but the previous value of the process signal is assumed to be a constant process signal value until the current value of the process signal leaves the further amplitude band. This significantly reduces the storage requirement.

Particularly advantageously, the size of the amplitude band and/or of the further amplitude band is selected according to the current operating state of the plant.

The size of the amplitude band essentially determines the compression rate of the compression method. During an operating state corresponding to a desired normal mode, the size of the amplitude band and/or of the further amplitude band can be selected large, for example, as the process signals to be stored mainly change little in an operating state of this kind.

As soon as the plant leaves this operating state and assumes, for example, a transitional operating state or a disturbed operating state, the size of the amplitude band is preferably selected smaller compared to normal mode. Operating states outside normal mode mainly require retrospective analysis of the stored process signals for which smaller signal changes are also indicative in order, for example, to verify the causes of a disturbance or a desired transitional behavior of the process signals.

To save storage space still further, process signals whose current values are around a zero point can be stored with value zero.

As the result of inaccuracies during acquisition or further processing, process signals often exhibit values which are virtually zero but formally have a non-zero value e.g. due to measurement noise. If the noisy process signal values are further processed, this means increased computational effort and possibly sequential errors during subsequent processing.

In the present embodiment this is prevented by defining a region around the zero point within which the value zero is postulated and stored for the process signals in question. Compared to storing noisy process signal values, the storing of the value zero requires much less storage and additionally prevents sequential errors during further processing of the process signal values.

In a particularly preferred embodiment the process signals are first stored in a header buffer and only subsequently processed by means of the compression method matched to the current operating state and stored as a compressed process signal set, the current operating state corresponding to an instant other than that of process signal storage in the header buffer.

The process signals are initially present in uncompressed form in the header buffer. Compression of the process signals does not take place until the compression method has been matched to the current operating state starting from a (later in time) current operating state in a quasi retrospective manner. In this way, process signals which arise e.g. ahead of an operating state change are processed using a compression method which is already matched to the new changed operating state. Thus, for example, in the event of a disturbance a compression method with lower compression rate can also be applied to process signals which are produced even before the disturbance has occurred. How far back in the past this retrospective adaptation of the compression method can take place depends among other things on the size of the header buffer.

In other words, with this embodiment the process signals are first written to a header buffer—e.g. for a period of 30 seconds—and only thereafter is a decision made, depending on the current operating state then present, as to which compression method is to be employed for the actual storage of the process signals. In this respect the instant or period of the current operating state does not correspond to the instant of storage of the process signals in the header buffer; rather the instant of storage of the process signals in the header buffer precedes the instant or period of the current operating state.

The limit value can represent, for example, a maximum value which the process signal may only just assume without endangering plant operation. Any violation of this limit may then be linked, for example, with a warning signal and fed out and/or stored.

It is particularly advantageous if the limit value is set depending on the current operating state.

An exemplary embodiment of the invention will now be explained in greater detail.

BRIEF DESCRIPTION OF THE DRAWING

The FIGURE shows the time response of the process signal to illustrate the method according to the invention.

DETAILED DESCRIPTION OF INVENTION

The FIGURE shows a process signal 5 which changes over time.

During the period t=0 to t=03 the process signal 5 increases from a near 0 value to a value in the region of 030, the increase in the process signal 5 being continuous and no or only small oscillations or increase variations occurring.

From instant t=03 onwards the process signal 5 tends to oscillations and more pronounced amplitude variations. In the case of a plant, for example, this could be caused by a load alternation occurring at instant t=03.

This operating state is indicated by reference numeral II in the FIGURE; the previous operating state during which the value of the process signal 5 varies less markedly and represents, for example, normal startup of the plant is indicated by reference numeral I.

The time response of the process signal 5 is denoted as signal amplitude A.

During the period of operating state I, the signal amplitude A of the process signal 5 is sampled at intervals 10 and the thereby determined amplitude value is stored if the value of the process signal 5 present at the sampling instant has left an amplitude band 20. In the present example this is not the case in the period t=02 to t=03.5; during the period t=0 to t=03.5 a compressed process signal set 25 is stored which comprises three values only, the value of the process signal 5 at instant t=0 being stored as the value 0, since signal noise is reasonably assumed at this instant and the value 0 is assumed to be the correct value for the process signal 5 at instant t=0.

Compression of the process signals to be stored therefore takes place such that, although five sampling instants occur up to instant t=03.5, only three values are stored as a compressed process signal set 25.

The amplitude band 20 is a criterion for whether or not the current value of the process signal 5 at the next sampling instant is stored again. In the present example the value of the process signal 5 at instant t=02 to instant t=04 remains stored and the current process signal value is not stored again until instant t=04.

During operating state I, sampling of the process signal 5 takes place at time interval 10 which has a size of one time unit. The size of this time interval is matched to the operating state I, as the changes in the process signal 5 are not marked and so a larger sampling interval and therefore a higher compression rate are sufficient.

From instant t=03 onwards, operating state I changes to operating state II during which more marked fluctuations and increase variations of the process signal 5 take place. From instant t=03 onwards, sampling is therefore performed at another time interval 15 which is smaller than time interval 10 and results in more frequent sampling of the process signal 5 during operating state II compared to operating state I. The interval between two samplings is half a time unit in operating state II and the sampling frequency used there is therefore twice as high as in operating state I.

In order to be able to store also small changes in the process signal 5 and detect them retrospectively, a further amplitude band 201 is specified whose size, due to the changed operating state II, is selected smaller than the amplitude band 20 which must be predominantly assigned to operating state I.

As the value of the process signal 5 at instant t=04.5 compared to the value of the process signal 5 at instant t=04 has left the further amplitude band 201, storing of the process signal 5 takes place both at instant t=04 and at instant t=04.5.

During operating state II, the compression rate of the compression method is therefore lower.

For the present example that can additionally be provided a header buffer in which the values of the process signal 5 are first written in uncompressed form and only subsequently processed using a compression method matched to the current operating state.

For example, the process signal values in the period t=0 to t=03 can first be sampled at short time intervals, e.g. at a time interval of one quarter of a time unit or less. On the basis of the current operating state present at instant t=03 it is then decided e.g. retrospectively to which compression method the process signals already stored previously in the header buffer are to be subjected retrospectively.

At instant t=03, operating state I is still present, and on the basis of this state it is specified quasi retrospectively that the process signal 5 is only sampled at interval 10 with the amplitude band 20 being used for additional compression.

The header buffer is e.g. large enough to accommodate the time response of the process signal 5 during the period t=0 to t=03. The absolute storage requirement of the header buffer depends on the sampling rate used for writing to the header buffer.

The header buffer is used in particular to enable process signals preceding an operating state change to be stored with a required accuracy and time/amplitude resolution.

The current operating state is the determining factor for selecting the compression method for historical, backdating process signal values in the header buffer.

The invention claimed is:

1. A method for storing plant non-image process signals for a plant having at least two operating states comprising:
    determining the current operating state of the plant;
    applying at least one of a plurality of corresponding compression methods responsive to the current operating state to a set of non-image process signals, wherein said applying the at least one of the plurality of compression methods comprises;
    acquiring non-image process signals at definable time intervals;
    storing the non-image process signals first in a header buffer at an instant other the instant corresponding to the current operating state;

examining the stored non-image process signals to ascertain whether a non-image process signal has remained within an amplitude band since it was last stored and how long ago it was last stored, wherein the examining step involves selecting the size of the amplitude to correspond to the current operating state of the plant;

determining the at least one of the plurality of compression methods to apply based on a result from examining the non-image process signals to minimize a loss of data significant for the non-image process signal; and storing the non-image process signal as a part of a compressed signal set if it was last stored longer ago than a predefined time interval.

2. A method for storing plant non-image process signals according to claim 1, the compression method further comprising:

acquiring non-image process signals at definable time intervals;

storing the non-image process signals first in a header buffer at an instant other the instant corresponding to the current operating state;

examining the non-image process signals to ascertain whether a non-image process signal has left a further amplitude band since it was last stored and how long ago it was last stored, wherein the examining step involves selecting the size of the further amplitude band to correspond to the current operating state of the plant;

determining the at least one of the plurality of compression methods to apply based on a result from examining the non-image process signals to minimize a loss of data significant for the non-image process signal; and storing the non-image process signal as a part of a compressed signal set matched to the current operating state only after it has left the further amplitude band.

3. The method for storing plant non-image process signals as claimed in claim 1, wherein the acquiring step further comprises acquiring the non-image process signals simultaneously so that the set of non-image process signals corresponds to a particular instant.

4. The method for storing plant non-image process signals as claimed claim 1, further comprising after the step of storing the set of compressed signals, determining that the operating state of the plant has changed to a second state, and applying a second compression method corresponding to the second operating state to a set of non-image process signals, wherein the second compression method examines the non-image process signals in accordance with an amplitude band corresponding to the second operating state of the plant.

5. The method for storing plant non-image process signals as claimed in claim 1, the acquiring step further comprising selecting time intervals for acquiring non-image process signals according to the current operating state of the plant, and acquiring non-image process signals at definable time intervals.

6. The method for storing plant non-image process signals as claimed in claim 1, applying at least one of the plurality of the corresponding compression methods step further comprises after the step of acquiring non-image process signals at definable time intervals, storing non-image process signals whose current values are in the region of a zero point with the value zero.

7. The method for storing plant non-image process signals as claimed in claim 1, wherein at least one of the plurality of the corresponding compression methods further comprises monitoring the non-image process signals for violation of a limit value.

8. The method for storing plant non-image process signals as claimed in claim 1, wherein in the step of applying at least one of the plurality of the corresponding compression methods for the current operating state to a set of non-image process signals, the applying step further comprises applying a compression method with a high compression rate for a plant operating state in which the non-image process signals to be stored have minimal change.

9. The method for storing plant non-image process signals as claimed in claim 1, wherein in the step of applying at least one of the plurality of the corresponding compression methods for the current operating state to a set of non-image process signals, the applying step further comprises applying a compression method with a low compression rate for a plant operating state in which the non-image process signals to be stored have marked change.

10. A method for storing plant non-image process signals for a plant as claimed in claim 1, wherein the plant comprises a turbine plant having at least two operating states, a start-up phase with markedly changing non-image process signals and a normal operating mode following the start-up phase during which the non-image process signals have less-marked change and more constant signals than in the start-up phase, wherein the step of determining the current operating state of the plant determines the start-up operating state; and wherein in the step of applying at least one of the plurality of the corresponding compression methods for the current operating state to a set of non-image process signals, the applying step further comprises applying a compression method with a low compression rate for start-up phase.

11. A method for storing plant non-image process signals for a plant as claimed in claim 1, wherein the plant comprises a turbine plant having at least two operating states, a start-up phase with generally markedly changing non-image process signals and a normal operating mode following the start-up phase during which the non-image process signals have less marked change and more constant signals than in the start-up phase, wherein the step of determining the current operating state of the plant step determines the normal operating state; and wherein in the step of applying at least one of the plurality of the corresponding compression methods for the current operating state normal operation to a set of non-image process signals, the applying step further comprises applying a compression method with a high compression rate for normal operation phase.

* * * * *